United States Patent
Uscola et al.

(10) Patent No.: US 10,707,180 B2
(45) Date of Patent: Jul. 7, 2020

(54) IMPEDANCE MATCHING CIRCUIT FOR RF DEVICES AND METHOD THEREFOR

(71) Applicant: NXP USA, INC., Austin, TX (US)

(72) Inventors: Ricardo Uscola, Tempe, AZ (US); Michele Lynn Miera, Gilbert, AZ (US); Sai Sunil Mangaonkar, Chandler, AZ (US); Jitesh Vaswani, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/959,812

(22) Filed: Apr. 23, 2018

(65) Prior Publication Data

US 2019/0326233 A1    Oct. 24, 2019

(51) Int. Cl.
*H01L 23/66* (2006.01)
*H01L 23/00* (2006.01)

(52) U.S. Cl.
CPC .............. *H01L 23/66* (2013.01); *H01L 24/05* (2013.01); *H01L 24/06* (2013.01); *H01L 24/48* (2013.01); *H01L 24/49* (2013.01); *H01L 2223/6611* (2013.01); *H01L 2223/6616* (2013.01); *H01L 2223/6672* (2013.01); *H01L 2224/05013* (2013.01); *H01L 2224/05025* (2013.01); *H01L 2224/05078* (2013.01); *H01L 2224/05084* (2013.01); *H01L 2224/05095* (2013.01);
(Continued)

(58) Field of Classification Search
CPC ......... H01L 23/66; H01L 24/05; H01L 24/06; H01L 24/48; H01L 24/49; H01L 2223/661; H01L 2223/6616; H01L 2223/6692; H01L 2224/05013; H01L 2224/05026; H01L 2224/05078; H01L 2224/05084; H01L 2224/05095; H01L 2224/05124; H01L 2224/05546; H01L 2224/05554; H01L 2224/06051; H01L 2224/48137; H01L 2224/49113; H01L 2224/49175; H01L 2924/1033; H01L 2924/1306; H01L 2924/1421; H01L 2924/19011; H01L 2924/19041
See application file for complete search history.

(56) References Cited

U.S. PATENT DOCUMENTS 6,465,297 B1 * 10/2002 Henry ............... H01L 28/40
257/E21.008
6,888,063 B1    5/2005 Lien et al.
(Continued)

OTHER PUBLICATIONS

NXP Semiconductors Data Sheet, "RF Power GaN Transistor", Rev. 1, Feb. 2017.

*Primary Examiner* — Dale E Page
*Assistant Examiner* — Quovaunda Jefferson (57) ABSTRACT

A bond pad structure and method are provided. The structure includes a first conductive layer formed over a substrate. A second conductive layer is formed over a first portion of the first conductive layer, and a first portion of the second conductive layer forms a first capacitor electrode. A third conductive layer is formed over the first conductive layer and second conductive layer, and a first portion of the third conductive layer forms a second capacitor electrode. A second portion of the third conductive layer forms a wire bond region. A dielectric material is disposed between the first capacitor electrode and the second capacitor electrode to form a first capacitor.

18 Claims, 5 Drawing Sheets

(52) U.S. Cl.
CPC ............ *H01L 2224/05124* (2013.01); *H01L 2224/05546* (2013.01); *H01L 2224/05553* (2013.01); *H01L 2224/05554* (2013.01); *H01L 2224/06051* (2013.01); *H01L 2224/48137* (2013.01); *H01L 2224/49112* (2013.01); *H01L 2224/49113* (2013.01); *H01L 2224/49175* (2013.01); *H01L 2924/1033* (2013.01); *H01L 2924/1306* (2013.01); *H01L 2924/1421* (2013.01); *H01L 2924/19011* (2013.01); *H01L 2924/19041* (2013.01)

(56) References Cited

U.S. PATENT DOCUMENTS

| | | |
|---|---|---|
| 9,438,184 B2 | 9/2016 | Jones et al. |
| 9,800,213 B1 | 10/2017 | Khalil et al. |
| 2012/0146723 A1 | 6/2012 | Blednov et al. |
| 2013/0256834 A1* | 10/2013 | Tan ............... H01L 23/481 |
| | | 257/532 |
| 2014/0145898 A1 | 5/2014 | Tokuda |
| 2015/0235933 A1 | 8/2015 | Ladhani et al. |
| 2015/0381121 A1* | 12/2015 | Jones ............... H01L 23/488 |
| | | 330/250 |
| 2015/0381122 A1 | 12/2015 | Musa et al. |
| 2016/0087586 A1 | 3/2016 | Szymanowski et al. |

* cited by examiner

IMPEDANCE MATCHING CIRCUIT FOR RF DEVICES AND METHOD THEREFOR

BACKGROUND

Field

This disclosure relates generally to semiconductor devices, and more specifically, to radio frequency (RF) semiconductor devices that include impedance matching circuits.

Related Art

Today, power RF devices are utilized in a variety of commercial, industrial, and automotive applications (e.g., cellular infrastructure power amplifier applications). These power RF devices are increasingly required to drive higher currents and operate at higher frequencies without significantly increasing costs. However, packaging for the RF devices and associated parasitic impedances can affect performance and impact overall efficiency.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an input impedance pre-matching circuit formed on an integrated passive device (IPD). The input impedance pre-matching circuit includes a pad structure having metal-insulator-metal (MIM) capacitors and an underlying shunt plate arranged to improve overall efficiency by substantially reducing or eliminating the frequency dispersive characteristic associated with high resistivity substrates. The shunt plate is formed from a conductive material such as a metal and is coupled to a ground voltage supply terminal. In operation, the shunt plate serves to shunt capacitive effects of the substrate and thus, providing a constant impedance characteristic of the IPD.

Figure 1:
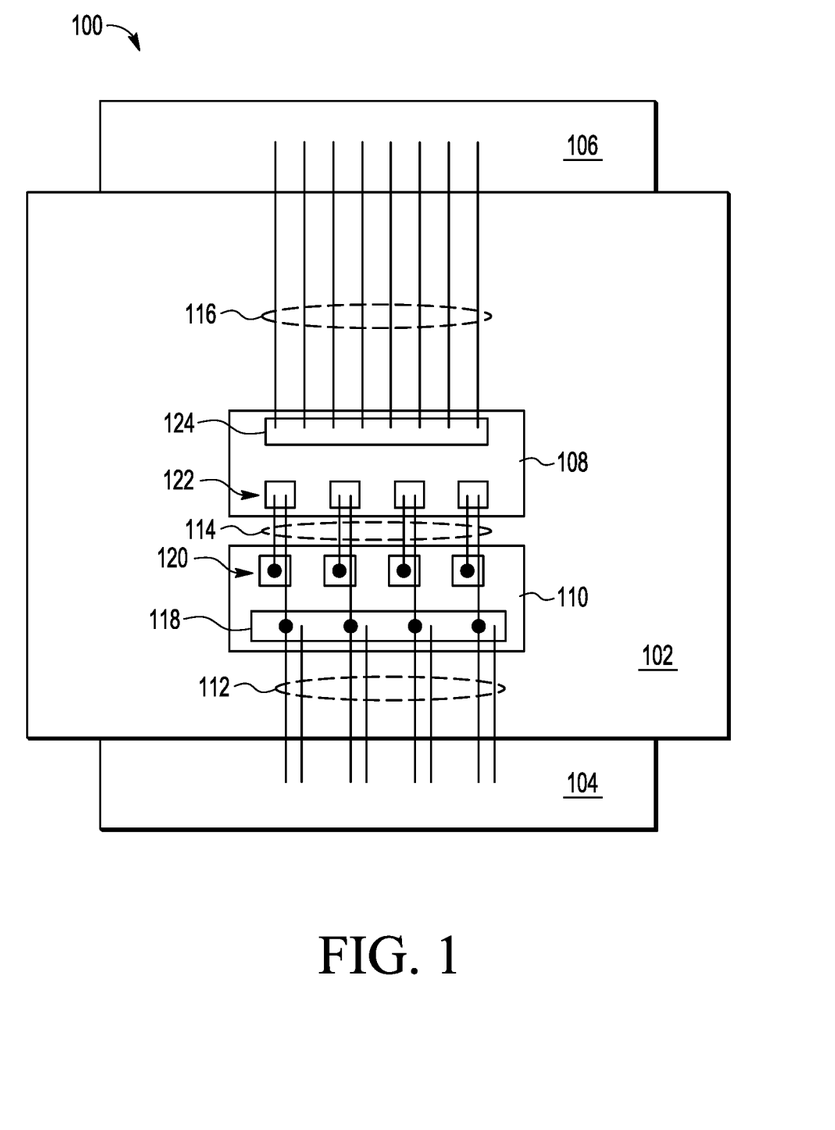
FIG. 1 illustrates, in a plan view, an exemplary packaged RF device at a stage of manufacture in accordance with an embodiment of the present invention.

FIG. 1 illustrates, in a plan view, an exemplary packaged RF device 100 at a stage of manufacture in accordance with an embodiment. Device 100 includes a flange 102, an input lead 104, an output lead 106, an RF semiconductor die 108, and an integrated passive device (IPD) 110, all of which may be packaged together as parts of the device. Bond wires 112 and 114 provide electrical interconnection among input lead 104, IPD 110 and die 108. Likewise, bond wires 116 provide electrical interconnection between output lead 106 and die 108.

Flange 102 includes a rigid electrically-conductive substrate, which has a thickness that is sufficient to provide structural support for components and elements of device 100. In addition, flange 102 may function as a heat sink for die 108, IPD 110, and other devices mounted on flange 102. Flange 102 has a top surface and a bottom surface and a substantially-rectangular perimeter that corresponds generally to the perimeter of the device 100. In this embodiment, flange 102 has a conductive top surface (e.g., the surface on which die 108 and IPD 110 is attached) and may be formed entirely from a conductive material. Flange 102 may also be used to provide a ground reference for device 100.

An isolation structure (not shown) is generally formed or attached to the top surface of flange 102. For example, the isolation structure may include a layer of metallization on its bottom surface, which may be soldered to or otherwise attached to the top surface of flange 102. The isolation structure is formed from a rigid, electrically insulating material, and has a top surface and an opposed bottom surface. Die 108 and IPD 110 are mounted on a generally central portion of the top surface of flange 102 that is exposed through an opening in the isolation structure.

Input and output leads 104 and 106 are mounted on a top surface of the isolation structure and are electrically isolated from the flange 102. Input and output leads 104 and 106 are located on opposed sides of the flange 102. Generally, the input and output leads 104 and 106 are oriented in order to allow for attachment of bond wires (e.g., bond wires 112-116) between the input and output leads 104 and 106 and components and elements (e.g., die 108 and IPD 110) coupled to the top surface of flange 102.

Die 108 includes a transistor formed on a semiconductor substrate. In this embodiment, die 108 includes a power field-effect transistor (FET) formed on a gallium nitride (GaN) substrate. The power FET of die 108 has a control terminal (e.g., gate terminal) and two current conducting terminals (e.g., drain and source terminals). The control terminal of the power FET (e.g., pads 122) is coupled to IPD 110 and input lead 104 by way of bond wires 112 and 114. In addition, one current conducting terminal (e.g., drain terminal, pad 124) of the power FET is coupled to the output lead 106 by way of bond wires 116. The other current conducting terminal (e.g., source terminal) of the power FET is coupled to the flange 102 (e.g., coupled to ground).

IPD 110 includes a passive circuit formed on a semiconductor substrate. In this embodiment, IPD 110 includes an input impedance pre-matching circuit formed on a high-resistivity (e.g., 500 ohm-cm and greater) silicon-based substrate. The input impedance pre-matching circuit of IPD 110 is coupled between input lead 104 and the power FET control terminal of die 108 by way of bond wires 112 and 114. IPD 110 includes an elongated bond pad 118 and a set of bond pads 120 for connectivity with bond wires 112 and 114. IPD 110 may be coupled to flange 102 using conductive epoxy, solder, solder bumps, sintering, eutectic bonds, and the like.

Figure 2:
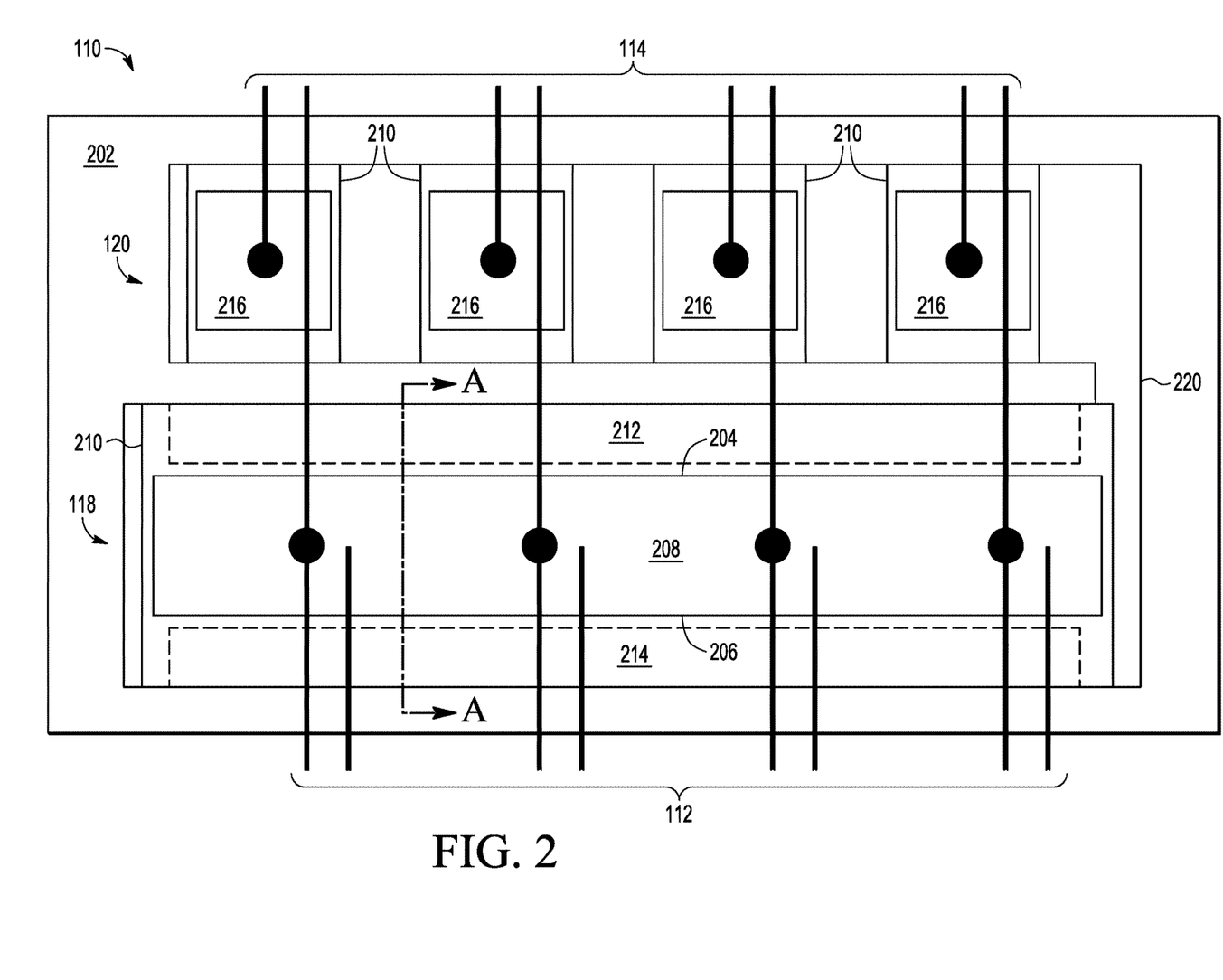
FIG. 2 illustrates, in a plan view, an example integrated passive device (IPD) of the RF device in accordance with an embodiment of the present invention.

FIG. 2 illustrates, in a more detailed plan view, the exemplary IPD 110 of FIG. 1 in accordance with an embodiment. IPD 110 includes elongated bond pad 118 and set bond pads 120 formed on semiconductor substrate 202. In this embodiment, substrate 202 is characterized as a high-resistivity (e.g., 500 ohm-cm and greater) silicon-based substrate.

Bond wires 112 and 114 electrically couple IPD 110 with input lead 104 and die 108 as shown in FIG. 1.

Figure 3:
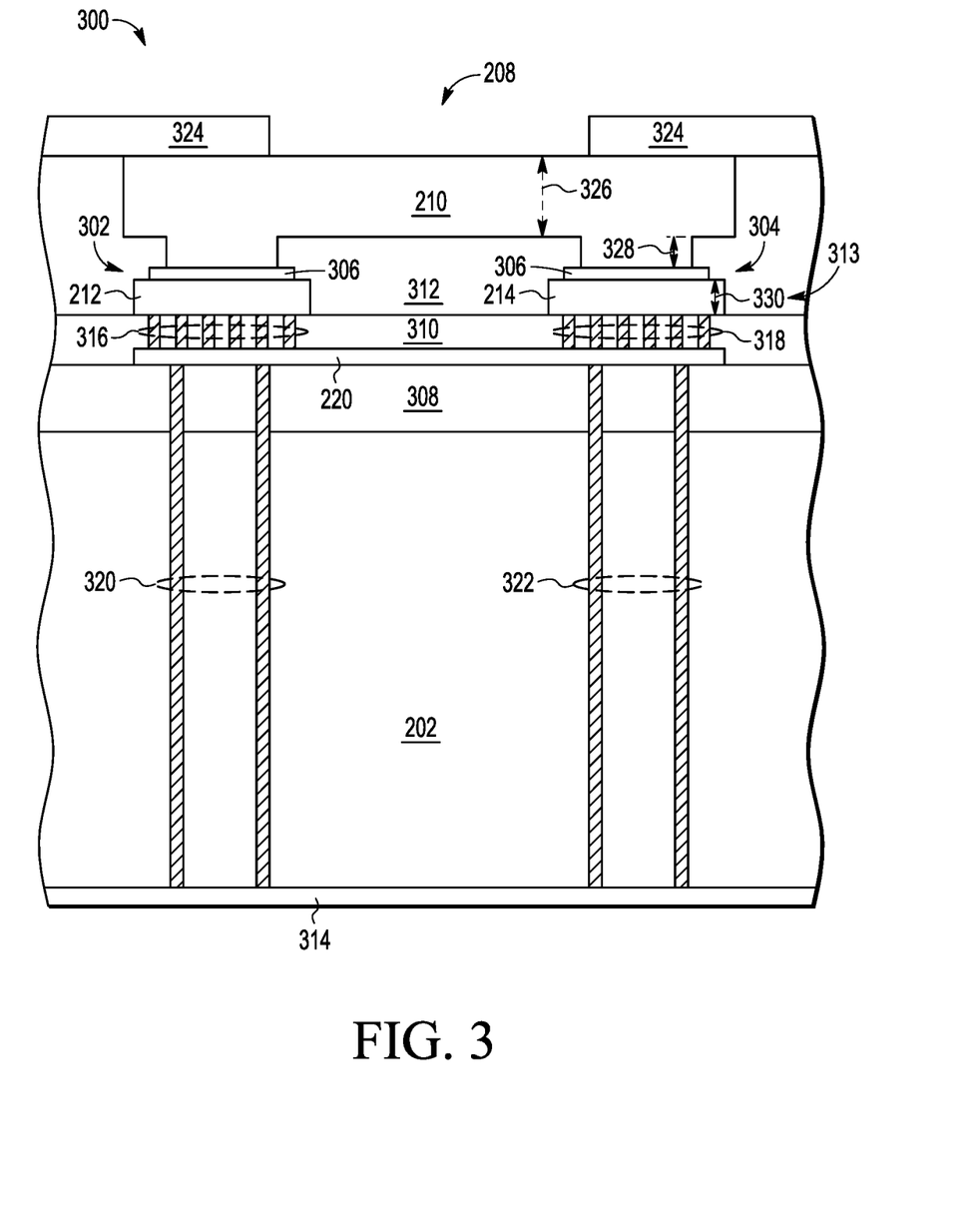
FIG. 3 illustrates, in a cross-sectional view, exemplary bond pad structure of the IPD of FIG. 2 along line A-A in accordance with an embodiment of the present invention.

Bond pad 118 includes an elongated rectangular bonding region (e.g., passivation opening) 208 on a first portion of a first conductive (e.g., metal) layer 210 formed over substrate 202. In this embodiment, the bonding region 208 is formed having two long edges (e.g., 204, 206) and two short edges. Metal-insulator-metal (MIM) capacitors are formed proximate to opposing long edges (e.g., 204, 206) of bonding region 208. Portions of the first conductive layer 210 form top electrodes (e.g., top plates) of the MIM capacitors, and underlying second conductive (e.g., metal) layer portions 212 and 214 form bottom electrodes (e.g., bottom plates) of the MIM capacitors. A first portion of a third conductive (e.g., metal) layer 220 underlies portions of first and second conductive layers and serves a shunt plate for preventing frequency dispersive effects associated with high-resistivity substrates. The first portion of third conductive layer 220 which underlies portions of first and second conductive layers may also be referred to as shunt plate 220. A cross-sectional view of bond pad 118 taken along line A-A is shown in FIG. 3. In use, bond pad 118 including MIM capacitors along with the bond wires 112 and 114 form a fundamental frequency matching network.

Still referring to FIG. 2, set of bond pads 120 includes a plurality of individual bond pads. The plurality may include any number of individual bond pads. Each individual bond pad of the set of bond pads 120 includes a bonding region (e.g., passivation opening) 216 on a second portion the first conductive layer 210 formed over substrate 202. MIM capacitors (not shown) may be formed on opposite edges of bonding region 216 in a similar arrangement as those formed with respect to bond pad 118. A second portion of the third conductive layer 220 underlies the set of bond pads 120 and provides additional mitigation of the frequency dispersion effects of substrate 202. In use, set of bond pads 120 along with bond wires 112 and 114 form a series resonant circuit tuned to provide a short at a second harmonic frequency and improve efficiency.

FIG. 3 illustrates, in a cross-sectional view, exemplary bond pad structure 300 of bond pad 118 including metal-insulator-metal (MIM) capacitors 302, 304 and underlying shunt plate 220 along line A-A in accordance with an embodiment. Bond pad structure 300 of IPD 110 includes semiconductor substrate 202 having top and bottom surfaces. Substrate 202 may be formed from any of a variety of semiconductor materials, including but not limited to silicon, germanium, gallium arsenide, gallium nitride, silicon-on-insulator (SOI), silicon-on-sapphire (SOS), silicon germanium-on-insulator (SGOI), and the like. A plurality of conductive layers 210, 313, 220 and insulating layers 308-312 are formed over the top surface of substrate 202. An additional conductive layer 314 is formed on the bottom surface of substrate 202 to facilitate electrical attachment to an underlying substrate (e.g., flange 102). For example, conductive layer 314 may be formed as a gold (or other metal) layer which facilitates forming a eutectic bond between IPD 110 and a separate conductive substrate (e.g., flange 102, FIG. 1). Alternatively, conductive layer 314 may be formed as a metal layer which facilitates sintering (e.g., silver sintering) IPD 110 to the separate conductive substrate.

Capacitors 302 and 304 are formed on opposite edges of bonding region 208. In this embodiment, capacitors 302 and 304 are implemented as MIM capacitors (e.g., with parallel metal plates electrically separated by a dielectric material). Portions of conductive layer 210 are configured to form top capacitor electrodes of MIM capacitors 302 and 304. Conductive layer 210 may be formed a variety of electrically conductive materials, such as copper (Cu), gold (Au), silver (Ag), aluminum (Al), nickel (Ni), tungsten (W), the like, and alloys thereof. In this embodiment, conductive layer 210 includes an aluminum material. In some embodiments, conductive layer 210 may be formed from a combination of layers and materials. For example, conductive layer 210 may be formed from a first deposition of an aluminum material followed by a plating process with a copper material such that a portion of the copper material is exposed in bonding region 208.

Bottom capacitor electrodes 212 and 214 are formed from portions of conductive layer 313 and vertically aligned with the top capacitor electrode portions of conductive layer 210. Conductive layer 313 may be formed a variety of electrically conductive materials, such as copper, gold, silver, aluminum, nickel, tungsten, the like, and alloys thereof. In this embodiment, conductive layer 313 includes an aluminum material. In some embodiments, conductive layer 313 may be formed from a metal material different from conductive layer 210.

Dielectric material 306 is disposed between the top capacitor electrodes and the bottom capacitor electrodes of MIM capacitors 302 and 304. The dielectric material 306 may be portions of a dielectric layer formed from a wide range of electrically isolating materials such as silicon dioxide, silicon nitride, silicon oxy-nitride, the like, and any combination of such materials. In this embodiment, dielectric material 306 is formed from a silicon nitride material having a thickness value in a range of 100 angstroms to 5000 angstroms (e.g., approximately 2000 angstroms).

Conductive layer 220 is formed over substrate 202. A portion of conductive layer 220 (e.g., shunt plate 220) underlies MIM capacitors 302 and 304 and a portion of conductive layer 210 proximate with bonding region 208. Conductive layer 220 may be formed from a variety of electrically conductive materials, such as copper, gold, silver, aluminum, nickel, tungsten, the like, and alloys thereof. In this embodiment, conductive layer 220 includes an aluminum material. In some embodiments, conductive layer 220 may be formed from a metal material different from conductive layers 210 and 313. In use, conductive layer 220 serves as a shunt plate to prevent frequency dispersion normally associated with high-resistivity silicon-based substrates. By preventing frequency dispersion, overall RF performance and efficiency is improved.

In the structure depicted in FIG. 3, a first inter-layer dielectric (ILD) layer 308 is disposed between conductive layer 220 and the top surface of substrate 202. ILD layer 308 may be formed from a grown silicon oxide or a deposited oxide such as tetraethyl orthosilicate (TEOS) or a combination thereof, for example. A second ILD layer 310 is disposed between conductive layer 220 and conductive layer 313, and a third ILD layer 312 is disposed between conductive layer 313 and conductive layer 210. Each of the ILD layers 310 and 312 may be formed from a deposited oxide such as TEOS, for example. A passivation layer 324 is formed over ILD 312 and conductive layer 210. Bonding region 208 is formed by an opening in the passivation layer exposing a top surface portion of conductive layer 210. Passivation layer 324 may be formed from any suitable passivation material such as silicon oxide, silicon nitride, polyimide, and the like, for example.

A first plurality of vias 316 is formed through ILD 310 to provide electrical connection between bottom electrode 212 of MIM capacitor 302 and conductive layer 220. A second plurality of vias 318 is formed through ILD 310 to provide electrical connection between bottom electrode 214 of MIM capacitor 304 and conductive layer 220. The first and second pluralities of vias 316 and 318 may each include any suitable number of individual vias. Each individual via of the first and second pluralities of vias 316 and 318 may be formed from a conductive (e.g., metal) material such as tungsten (W), for example.

A first plurality of through-silicon vias (TSVs) 320 is formed through ILD 308 and substrate 202 to provide electrical connection between conductive layer 220 and conductive layer 314. A second plurality of TSVs 322 is formed through ILD 308 and substrate 202 to provide electrical connection between conductive layer 220 and conductive layer 314. The first and second pluralities of TSVs 320 and 322 may each include any one or more TSVs. Each individual TSV of the first and second pluralities of TSVs 320 and 322 may be formed from a conductive (e.g., metal) material such as tungsten, for example.

In operation, bond pad structure 300 of bond pad 118 along with bond wires 112 of FIG. 1 serves as a fundamental frequency matching network. Characteristics of the frequency matching network (e.g., terminal impedance) can be determined from a combination of capacitance values of MIM capacitors 302 and 304, inductance and resistance values of the bond wires, and other aspects of the bond pad structure. For example, thicknesses of conductive layers may be adjusted to achieve a desired performance target (e.g., higher efficiency and higher gain). The general thickness 326 of conductive layer 210 can be reduced (e.g., made thinner) to decrease a resistive component of the frequency matching network. For example, the thickness 326 of conductive layer 210 may have value of 1.7 microns or less. Likewise, top capacitor electrode thickness 328 and bottom capacitor electrode thickness 330 of MIM capacitors 302 and 304 can also be reduced to decrease the resistive component of the frequency matching network. For example, the top capacitor electrode thickness 328 may have value of 0.6 microns or less, and the bottom capacitor electrode thickness 330 may have a value of 0.6 microns or less. In some embodiments, it may be desirable to optimize resistivity of substrate 202 to achieve the desired performance target and further minimize the frequency dispersive nature.

Figure 4:
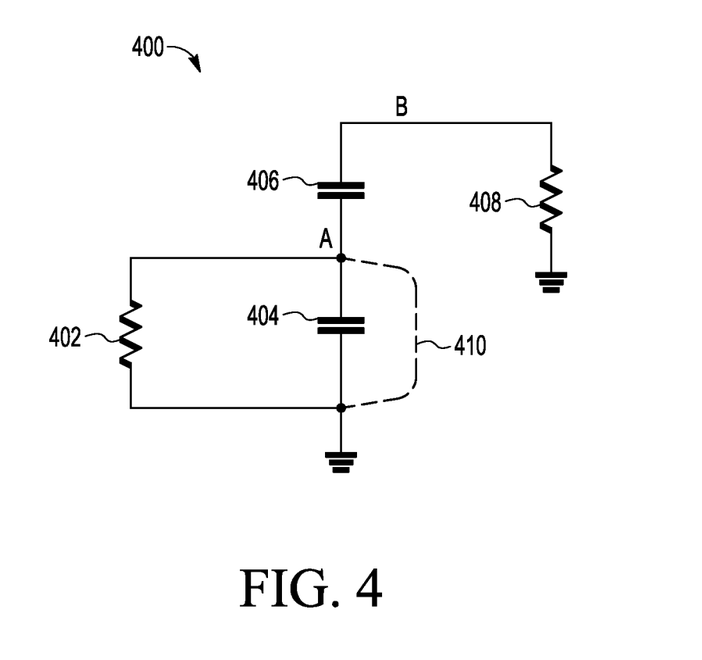
FIG. 4 illustrates, in simplified schematic diagram form, an exemplary equivalent circuit of the bond pad structure of FIG. 3 in accordance with an embodiment of the present invention.

FIG. 4 illustrates, in simplified schematic diagram form, an exemplary shunt capacitance equivalent circuit 400 of the bond pad structure of FIG. 3 in accordance with an embodiment of the present invention. Equivalent circuit 400 includes a first resistor 402 and a first capacitor 404 coupled in parallel. First resistor 402 and first capacitor 404 are representative of the resistance and capacitance of substrate 202 (e.g., with the bottom surface grounded). A second capacitor 406 is coupled to first resistor 402 and first capacitor 404 at node A (e.g., top surface of substrate 202). Second capacitor 406 is representative of the capacitance from a top surface of bonding region 208 (e.g., node B) through ILD layers 308-312 to the top surface of substrate 202 (e.g., node A). A second resistor 408 is coupled in series with second capacitor 406 at bonding region 208 (e.g., node B). Second resistor 408 is representative of the termination impedance coupled to bonding region 208 (e.g., by way of bond wires). Equivalent circuit 400 includes a shunt plate 410 (e.g., conductive layer 220 portion depicted in FIG. 3) shown as a dashed line between node A and ground voltage supply terminal. In operation, shunt plate 410 serves to effectively shunt substrate capacitance (404) and virtually eliminate the frequency dispersive behavior associated with high resistivity substrates.

Figure 5:
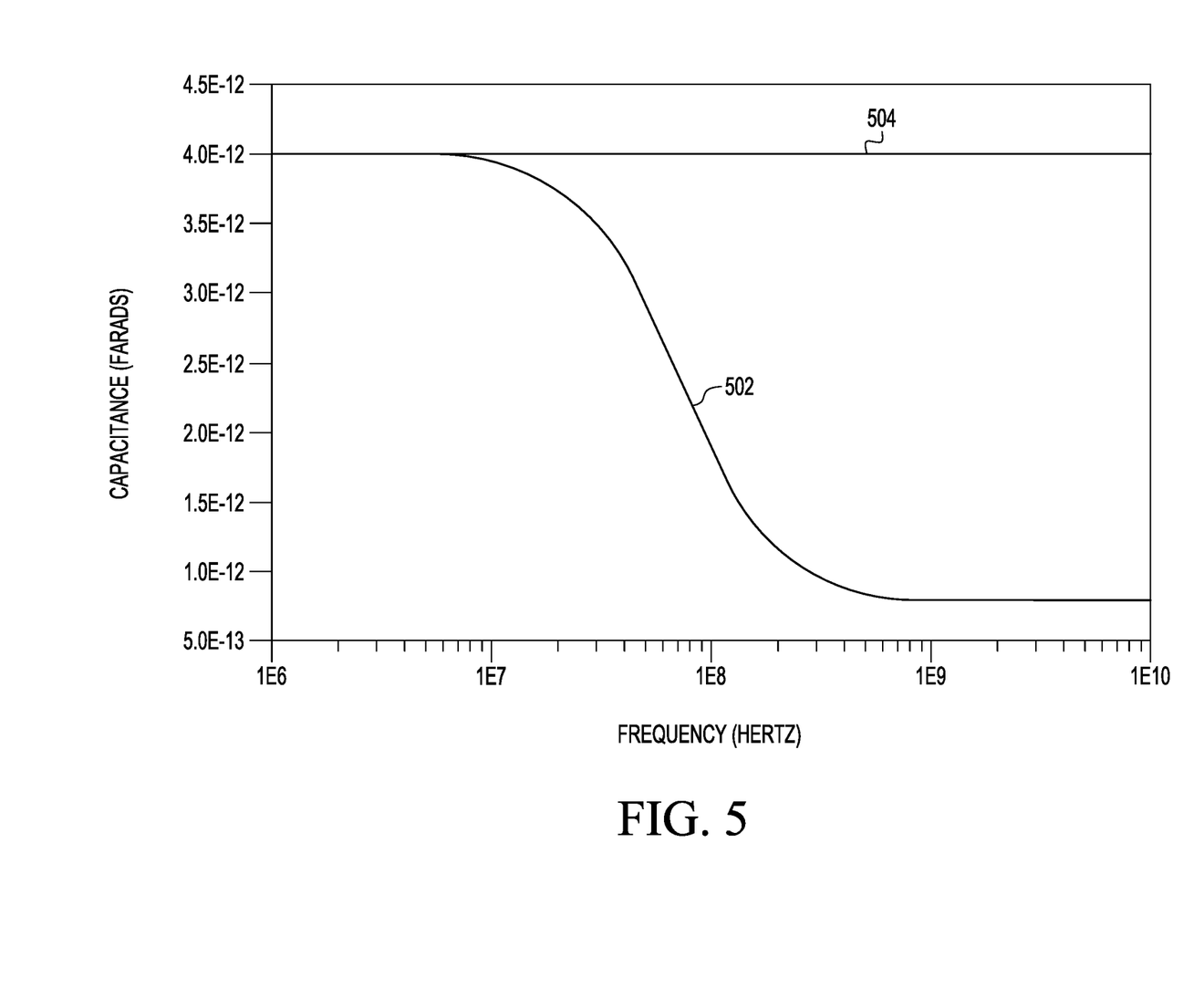
FIG. 5 illustrates, in a graphical view, a capacitance versus frequency plot of the equivalent circuit of FIG. 4 in accordance with an embodiment of the present invention.

FIG. 5 illustrates, in a graphical view, a capacitance versus frequency plot of the equivalent circuit of FIG. 4 in accordance with an embodiment of the present invention. Frequency values are shown in hertz (Hz) on the X-axis, and capacitance values are shown in farads (F) on the Y-axis. For illustration purposes, equivalent circuit 400 includes example component values such as resistor 402=1000 ohms, capacitor 404=1.0 pF, capacitor 406=4.0 pF, and termination resistor 408=50 ohms. FIG. 5 includes a first waveform 502 depicting simulation results of equivalent circuit 400 without shunt plate 410, and a second waveform 504 depicting simulation results of equivalent circuit 400 with shunt plate 410. Here, the first waveform 502 shows equivalent capacitance values varying with frequency. For example, at lower frequencies (e.g., 1 MHz to 10 MHz), the capacitance value shown in first waveform 502 is approximately 4.0 pF, while at higher frequencies (e.g., 1 GHz to 10 GHz), the capacitance value shown in first waveform 502 is approximately 0.8 pF. On the other hand, second waveform 504 shows equivalent capacitance values remaining constant (e.g., approximately 4.0 pF) with frequency. For example, shunt plate 410 serves as a shunt below bonding region 208 negating substrate capacitance (404), and thus, capacitance values of equivalent circuit 400 remains virtually constant over a very large frequency range (e.g., 1 MHz to 10 GHz, and beyond).

Generally, there is provided, an integrated passive device (IPD) including a semiconductor substrate; a first conductive layer formed over the substrate; a second conductive layer formed over a first portion of the first conductive layer, a first portion of the second conductive layer coupled to the first conductive layer and comprising a first capacitor electrode; a third conductive layer formed over the first conductive layer and second conductive layer, a first portion of the third conductive layer comprising a second capacitor electrode and a second portion of the third conductive layer comprising a wire bond region; and a dielectric material disposed between the first capacitor electrode and the second capacitor electrode, the first capacitor electrode, the dielectric material, and the second capacitor electrode configured to form a first capacitor. The IPD may further include an inter-level dielectric (ILD) material disposed between the second conductive layer and the first conductive layer, and wherein the first portion of the second conductive layer is coupled to the first conductive layer by way of a via. The IPD may further include a fourth conductive layer formed on a bottom surface of the substrate, the fourth conductive layer coupled to the first conductive layer by way of a through-silicon-via (TSV). Each of the first, second, and third conductive layers may be formed from a material comprising aluminum. The dielectric material may be formed from an electrically insulating material comprising silicon nitride (SiN). The first portion of the second conductive layer may have a thickness value of 0.6 microns or less. The semiconductor substrate may include silicon and may have a resistivity value of 500 ohm-cm or greater. The IPD may further include a bond wire attached to the third conductive layer at the wire bond region. An end of the bond wire may be further attached to a gate terminal of a power field-effect transistor (FET) formed on a gallium nitride (GaN) substrate.

In another embodiment, there is provided, a radio frequency (RF) device including an integrated passive device (IPD) which includes a semiconductor substrate; a first conductive layer formed over the substrate; a second conductive layer formed over a first portion of the first conductive layer, a first portion of the second conductive layer coupled to the first conductive layer and comprising a first capacitor electrode; a third conductive layer formed over the first conductive layer and second conductive layer, a first portion of the third conductive layer comprising a second capacitor electrode and a second portion of the third conductive layer comprising a wire bond region; and a dielectric material disposed between the first capacitor electrode and the second capacitor electrode, the first capacitor electrode, the dielectric material, and the second capacitor electrode configured to form a first capacitor; and a semiconductor die including an RF power transistor, the semiconductor die coupled to the wire bond region of the IPD by way of a bond wire. The device may further include a fourth conductive layer formed on a bottom surface of the substrate, the fourth conductive layer coupled to the third conductive layer by way of a through-silicon-via (TSV). The second conductive layer may be coupled to the first conductive layer by way of a via formed through an ILD material disposed between the second conductive layer and the first conductive layer. The device may further include a second capacitor, the second capacitor including: a second portion of the second conductive layer coupled to the first conductive layer and comprising a third capacitor electrode; and a second portion of the third conductive layer comprising a fourth capacitor electrode, the dielectric material disposed between the third capacitor electrode and the fourth capacitor electrode; wherein the wire bond region is formed as an elongated rectangular wire bond region having a first edge and a second edge, the first capacitor vertically aligned proximate to the first edge and the second capacitor vertically aligned proximate to the second edge, the second edge opposite of the first edge. The bond wire may be attached to the semiconductor die at a gate terminal of the RF power transistor, the semiconductor die including a gallium nitride (GaN) substrate. The semiconductor substrate of the IPD may include silicon and may have a resistivity value of 500 ohm-cm or greater. The third conductive layer may be formed as a copper material plated over an aluminum material, the copper material exposed in the wire bond region. The dielectric material may be formed from an electrically insulating material comprising silicon nitride (SiN).

In yet another embodiment, there is provided, a method of forming integrated passive device (IPD) including patterning a first conductive layer to form a shunt plate over a substrate; patterning a second conductive layer to form a first capacitor electrode, the first capacitor electrode located over a first portion of the shunt plate; forming a via to electrically connect the first capacitor electrode with the shunt plate; forming a dielectric layer over the second conductive layer, a first portion of the dielectric layer vertically aligned with the first capacitor electrode; and patterning a third conductive layer over the dielectric layer, a first portion of the third conductive layer comprising a wire bond region and a second portion of the third conductive layer comprising a second capacitor electrode, the second capacitor electrode vertically aligned with the first capacitor electrode. The method may further include depositing a fourth conductive layer on a bottom surface of the substrate; and forming a through-silicon-via (TSV) to electrically connect the shunt plate with the fourth conductive layer. The first capacitor electrode, the first portion of the dielectric layer, and the second capacitor electrode may be configured to form a first metal-insulator-metal (MIM) capacitor.

By now it should be appreciated that there has been provided, an input impedance pre-matching circuit formed on an integrated passive device (IPD). The input impedance pre-matching circuit includes a pad structure having metal-insulator-metal (MIM) capacitors and underlying shunt plate arranged to improve overall efficiency by substantially reducing or eliminating the frequency dispersive characteristic associated with high resistivity substrates. The shunt plate is formed from a conductive material such as a metal and coupled to a ground voltage supply terminal. In operation, the shunt plate serves to shunt capacitive effects of the substrate and thus, providing a constant impedance characteristic of the IPD.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

As used herein, the term "exemplary" refers to "serving as an example, instance, or illustration." Any implementation described herein as exemplary is not necessarily to be construed as preferred or advantageous over other implementations.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated passive device (IPD) comprising:
   a semiconductor substrate;
   a first conductive layer formed over the substrate;
   a second conductive layer formed over a first portion of the first conductive layer, a first portion of the second conductive layer coupled to the first conductive layer and comprising a first capacitor electrode;
   a third conductive layer formed over the first conductive layer and second conductive layer, a first portion of the third conductive layer comprising a second capacitor electrode and a second portion of the third conductive layer comprising a wire bond region;
   a fourth conductive layer formed on a bottom surface of the substrate, the fourth conductive layer coupled to the first conductive layer by way of a through-silicon-via (TSV);
   a bond wire attached to the third conductive layer at the wire bond region, an end of the bond wire is further attached to a gate terminal of a power field-effect transistor (FET); and
   a dielectric material disposed between the first capacitor electrode and the second capacitor electrode, the first capacitor electrode, the dielectric material, and the second capacitor electrode configured to form a first capacitor.

2. The IPD of claim 1, further comprising an inter-level dielectric (ILD) material disposed between the second conductive layer and the first conductive layer, and wherein the first portion of the second conductive layer is coupled to the first conductive layer by way of a via.

3. The IPD of claim 1, wherein each of the first, second, and third conductive layers is formed from a material comprising aluminum.

4. The IPD of claim 1, wherein dielectric material is formed from an electrically insulating material comprising silicon nitride (SiN).

5. The IPD of claim 1, wherein the first portion of the second conductive layer has a thickness value of 0.6 microns or less.

6. The IPD of claim 1, wherein the semiconductor substrate comprises silicon and has a resistivity value of 500 ohm-cm or greater.

7. The IPD of claim 1, wherein the power FET is formed on a gallium nitride (GaN) substrate.

8. A radio frequency (RF) device comprising:
   an integrated passive device (IPD) comprising:
      a semiconductor substrate;
      a first conductive layer formed over the substrate;
      a second conductive layer formed over a first portion of the first conductive layer, a first portion of the second conductive layer coupled to the first conductive layer and comprising a first capacitor electrode;
      a third conductive layer formed over the first conductive layer and second conductive layer, a first portion of the third conductive layer comprising a second capacitor electrode and a second portion of the third conductive layer comprising a wire bond region;
      a fourth conductive layer formed on a bottom surface of the substrate, the fourth conductive layer coupled to the third conductive layer by way of a through-silicon-via (TSV); and
      a dielectric material disposed between the first capacitor electrode and the second capacitor electrode, the first capacitor electrode, the dielectric material, and the second capacitor electrode configured to form a first capacitor; and
   a semiconductor die comprising an RF power transistor, the semiconductor die coupled to the wire bond region of the IPD by way of a bond wire.

9. The device of claim 8, wherein the second conductive layer is coupled to the first conductive layer by way of a via formed through an ILD material disposed between the second conductive layer and the first conductive layer.

10. The device of claim 8, further comprising a second capacitor, the second capacitor comprising:
   a second portion of the second conductive layer coupled to the first conductive layer and comprising a third capacitor electrode; and
   a second portion of the third conductive layer comprising a fourth capacitor electrode, the dielectric material disposed between the third capacitor electrode and the fourth capacitor electrode;
   wherein the wire bond region is formed as an elongated rectangular wire bond region having a first edge and a second edge, the first capacitor vertically aligned proximate to the first edge and the second capacitor vertically aligned proximate to the second edge, the second edge opposite of the first edge.

11. The device of claim 8, wherein the bond wire is attached to the semiconductor die at a gate terminal of the RF power transistor, the semiconductor die comprising a gallium nitride (GaN) substrate.

12. The device of claim 8, wherein the semiconductor substrate of the IPD comprises silicon and has a resistivity value of 500 ohm-cm or greater.

13. The device of claim 8, wherein the third conductive layer is formed as a copper material plated over an aluminum material, the copper material exposed in the wire bond region.

14. The device of claim 8, wherein dielectric material is formed from an electrically insulating material comprising silicon nitride (SiN).

15. A method of forming integrated passive device (IPD) comprising:
   patterning a first conductive layer to form a shunt plate over a substrate;
   patterning a second conductive layer to form a first capacitor electrode, the first capacitor electrode located over a first portion of the shunt plate;
   forming a via to electrically connect the first capacitor electrode with the shunt plate;
   forming a dielectric layer over the second conductive layer, a first portion of the dielectric layer vertically aligned with the first capacitor electrode;
   patterning a third conductive layer over the dielectric layer, a first portion of the third conductive layer comprising a wire bond region and a second portion of the third conductive layer comprising a second capacitor electrode, the second capacitor electrode vertically aligned with the first capacitor electrode;
   attaching a first end of a bond wire to the third conductive layer at the wire bond region and a second end of the bond wire to a gate terminal of a power field-effect transistor (FET);
   depositing a fourth conductive layer on a bottom surface of the substrate; and
   forming a through-silicon-via (TSV) to electrically connect the shunt plate with the fourth conductive layer.

16. The method of claim 15, wherein the first capacitor electrode, the first portion of the dielectric layer, and the second capacitor electrode are configured to form a first metal-insulator-metal (MIM) capacitor.

17. An integrated passive device (IPD) comprising:

a semiconductor substrate;

a first conductive layer formed over the substrate;

a second conductive layer formed over a first portion of the first conductive layer, a first portion of the second conductive layer coupled to the first conductive layer and comprising a first capacitor electrode;

a third conductive layer formed over the first conductive layer and second conductive layer, a first portion of the third conductive layer comprising a second capacitor electrode and a second portion of the third conductive layer comprising a wire bond region;

a dielectric material disposed between the first capacitor electrode and the second capacitor electrode, the first capacitor electrode, the dielectric material, and the second capacitor electrode configured to form a first capacitor; and a bond wire attached to the third conductive layer at the wire bond region, an end of the bond wire is further attached to a gate terminal of a power field-effect transistor (FET) formed on a gallium nitride (GaN) substrate.

18. A radio frequency (RF) device comprising:

an integrated passive device (IPD) comprising:

a semiconductor substrate;

a first conductive layer formed over the substrate;

a second conductive layer formed over a first portion of the first conductive layer, a first portion of the second conductive layer coupled to the first conductive layer and comprising a first capacitor electrode;

a third conductive layer formed over the first conductive layer and second conductive layer, a first portion of the third conductive layer comprising a second capacitor electrode and a second portion of the third conductive layer comprising a wire bond region; and     a dielectric material disposed between the first capacitor electrode and the second capacitor electrode, the first capacitor electrode, the dielectric material, and the second capacitor electrode configured to form a first capacitor; and a semiconductor die comprising an RF power transistor, the semiconductor die comprising a gallium nitride (GaN) substrate and coupled to the wire bond region of the IPD by way of a bond wire, the bond wire attached to the semiconductor die at a gate terminal of the RF power transistor.

\* \* \* \* \*